United States Patent
Peng et al.

(10) Patent No.: US 8,570,752 B2
(45) Date of Patent: Oct. 29, 2013

(54) SERVER HOLDER AND SERVER SYSTEM INCLUDING SAME

(75) Inventors: Wen-Tang Peng, New Taipei (TW); Hai-Chen Zhou, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 289 days.

(21) Appl. No.: 13/217,294

(22) Filed: Aug. 25, 2011

(65) Prior Publication Data

US 2012/0300410 A1  Nov. 29, 2012

(30) Foreign Application Priority Data

May 24, 2011  (CN) .......................... 2011 1 0135192

(51) Int. Cl.
  *H05K 5/02*  (2006.01)
(52) U.S. Cl.
  USPC ... 361/727; 361/679.02; 361/724; 312/223.1; 312/223.2

(58) Field of Classification Search
  USPC ......................................................... 361/727
  See application file for complete search history.

(56) References Cited

U.S. PATENT DOCUMENTS

| | | | |
|---|---|---|---|
| 8,456,843 B2 * | 6/2013 | Wang et al. | 361/724 |
| 2009/0154114 A1 * | 6/2009 | Peng et al. | 361/728 |
| 2012/0273438 A1 * | 11/2012 | Nordin et al. | 211/26 |

\* cited by examiner

*Primary Examiner* — Anthony Q Edwards
(74) *Attorney, Agent, or Firm* — Altis & Wispro Law Group, Inc.

(57) ABSTRACT

A server system includes a number of servers and a server holder. Each server includes two opposite sidewalls with each having a sliding rail formed thereon. The server holder includes two opposite lateral plates and a number of supporting structures. Each lateral plate defines a plurality of rows of receiving holes. Each supporting structure is received in one receiving hole, and includes a supporting block and a torsion spring positioned on the supporting bock. The supporting block is pivotably connected to one of the lateral plates, defines a sliding slot, and includes a resisting surface facing towards interior of the server holder. The sliding rail is slidable along the sliding slot. The torsion spring is configured for providing an elastic force to push the supporting block to keep the resisting surface resisting against one sidewall.

19 Claims, 8 Drawing Sheets

SERVER HOLDER AND SERVER SYSTEM INCLUDING SAME

BACKGROUND

1. Technical Field

The present disclosure relates to electronic device holders and, particularly, to a server holder and a server system including the server holder.

2. Description of Related Art

With the development of information technology, data centers with a large number of servers are widely used. In order to save space, these servers are typically received in server holders, each server holder can receive a number of servers. Typically, the server holder includes a bottom plate, a top plate opposite to the bottom plate, and two opposite lateral plates connecting between the bottom plate and the top plate. Each lateral plate has a number of supporting structures for supporting the servers. However, the servers would easily slide relative to the supporting structure because of shake etc. As a result, the servers cannot be fixed in the server holder firmly.

What is needed is an electronic device which can ameliorate the above-mentioned limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Embodiments of the present disclosure will now be described in detail below, with reference to the accompanying drawing.

Figure 1:
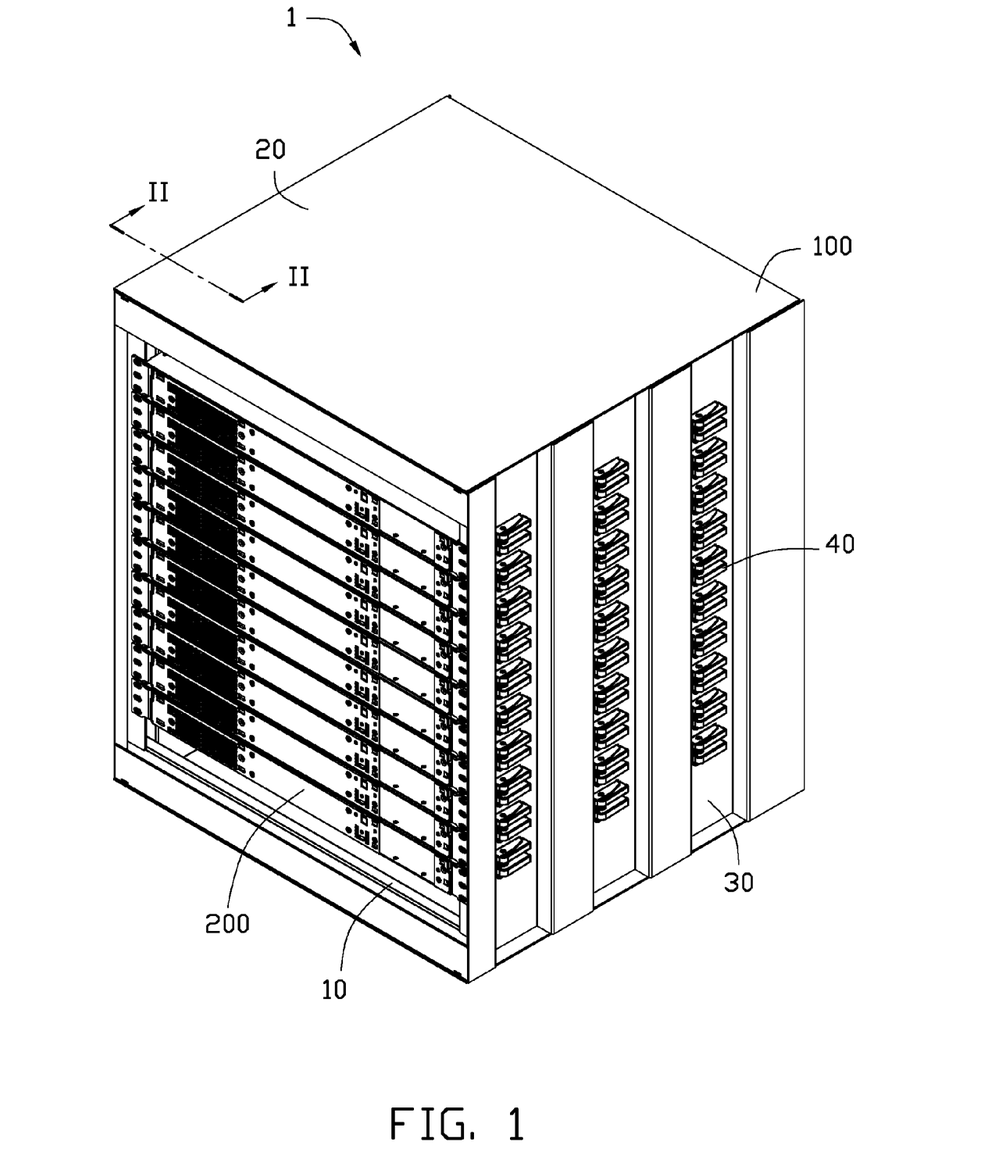
FIG. 1 is a schematic view of a server system according to an exemplary embodiment.
Figure 2:
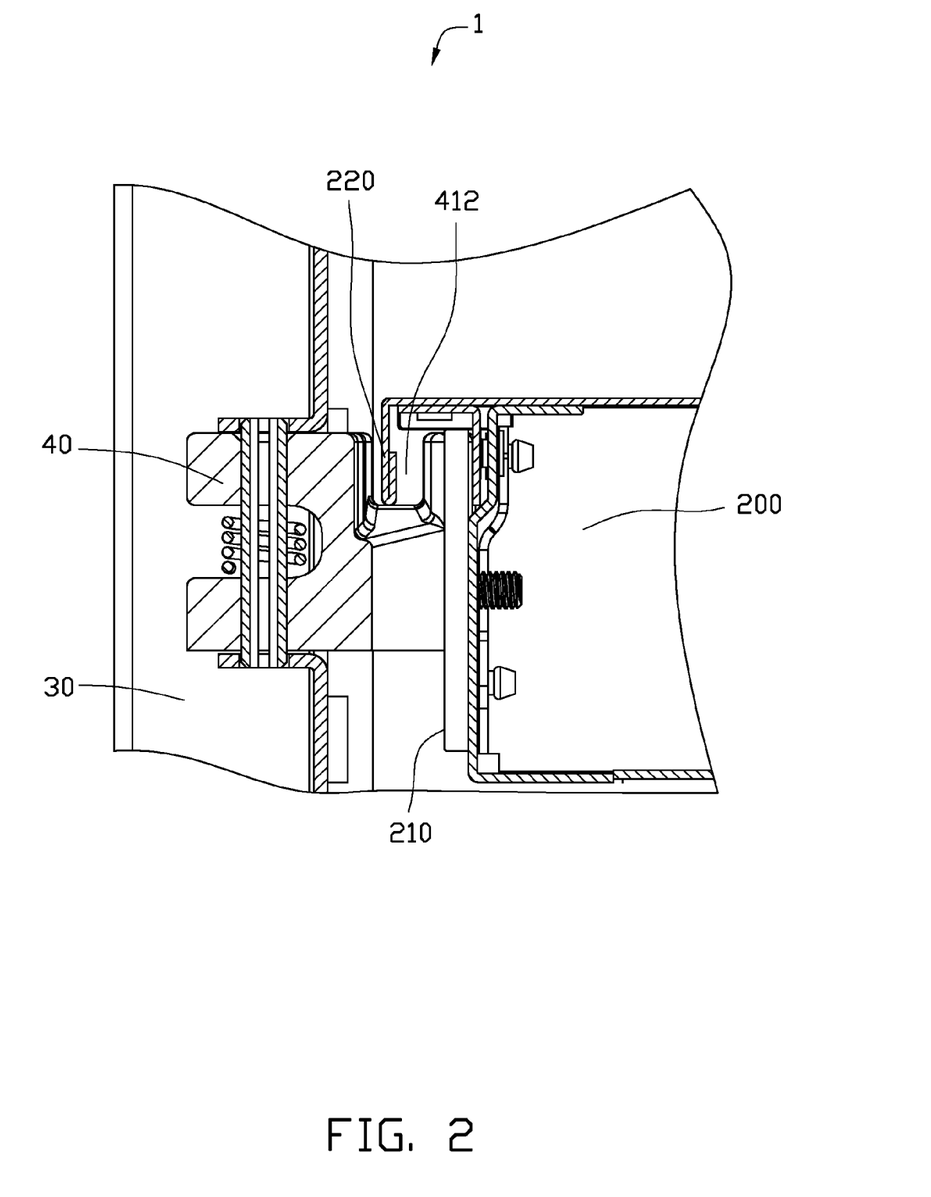
FIG. 2 is a partial, cross-sectional view of the server system taken along line II-II of FIG. 1.
Figure 3:
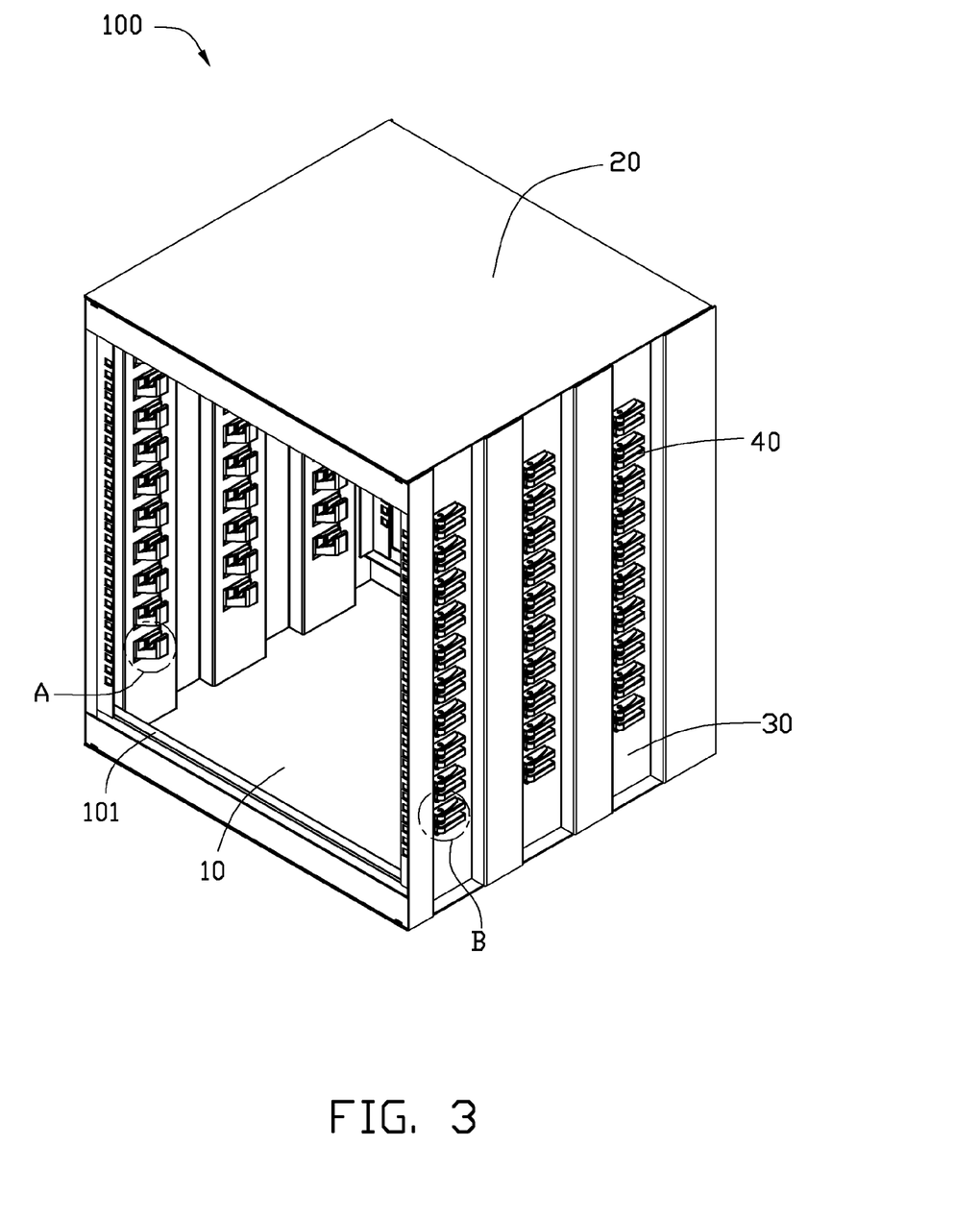
FIG. 3 is a schematic view of a server holder of the server system of FIG. 1.

Referring to FIGS. 1 to 3, a server system 1 according to an exemplary embodiment is shown. The server system 1 includes a server holder 100 and a number of servers 200 received in the server holder 100.

The server holder 100 includes a bottom plate 10, a top plate 20, two opposite lateral plates 30, and a number of supporting structures 40 assembled on the lateral plates 30. Each server 200 includes two sidewalls 210 for engaging with the supporting structures 40. Each sidewall 210 includes a sliding rail 220 extending from a top end of the sidewall 210.

The bottom plate 10 is opposite to the top plate 20. The two opposite lateral plates 30 are connected between the bottom plate 10 and the top plate 20. The server holder 100 defines an inserting opening 101 between the two opposite lateral plates 30, the servers 200 can be inserted into the server holder 100 through the inserting opening 101. In the present embodiment, the two opposite lateral plates 30 are parallel to each other, and are perpendicular to the bottom plate 10 and the top plate 20.

Figure 4:
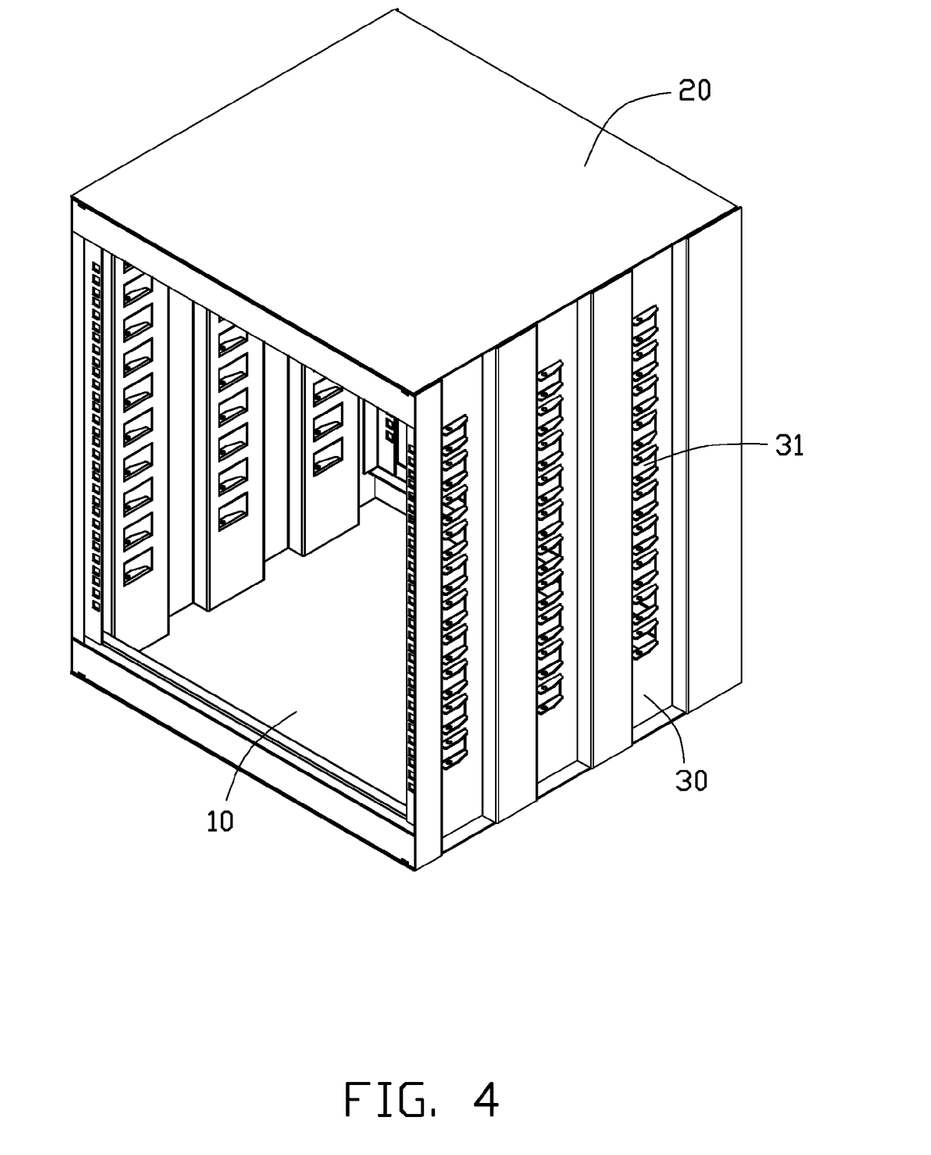
FIG. 4 is a schematic view of the server holder of FIG. 3 without supporting structures.
Figure 5:
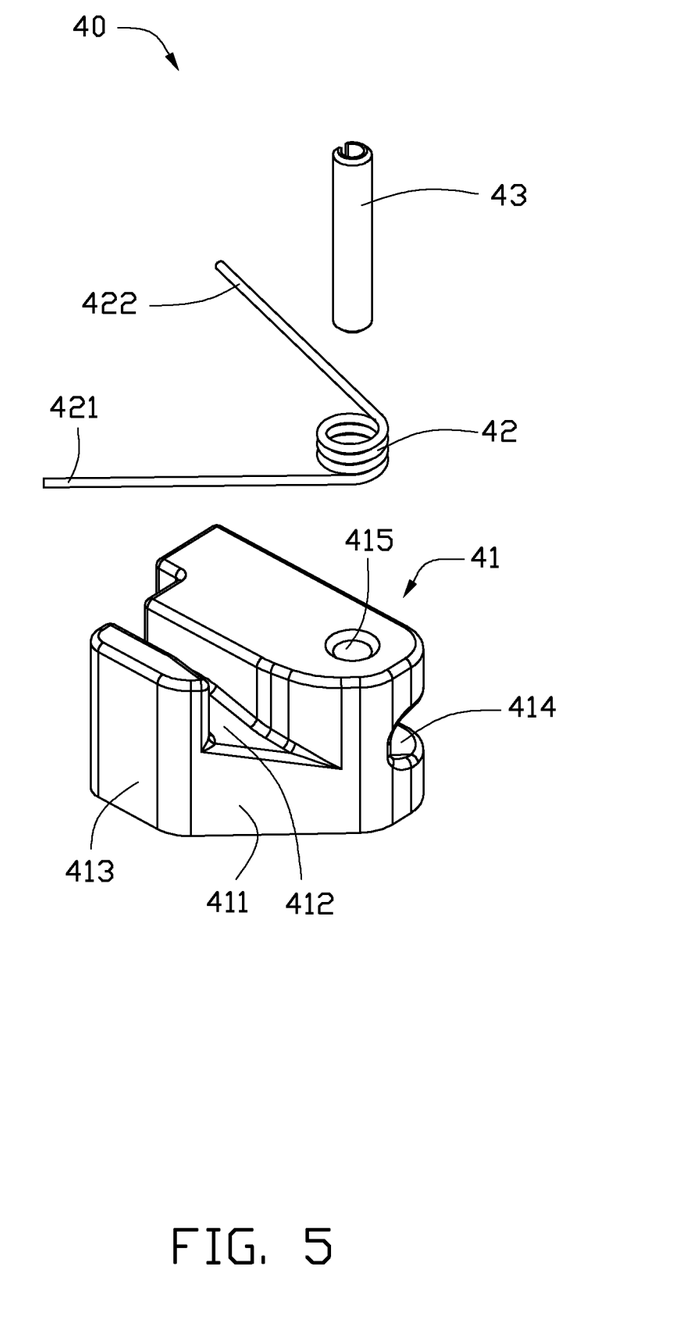
FIG. 5 is a schematic view of a supporting structure of the server holder of FIG. 3.
Figure 6:
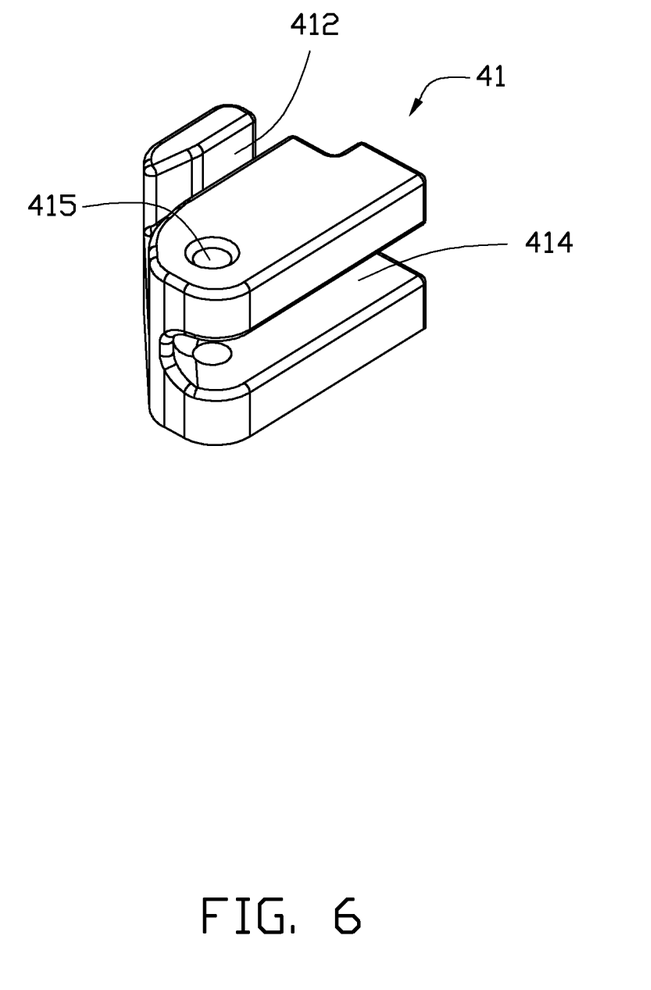
FIG. 6 is a schematic view of a supporting block of the supporting structure of FIG. 6, viewed from another direction.
Figure 7:
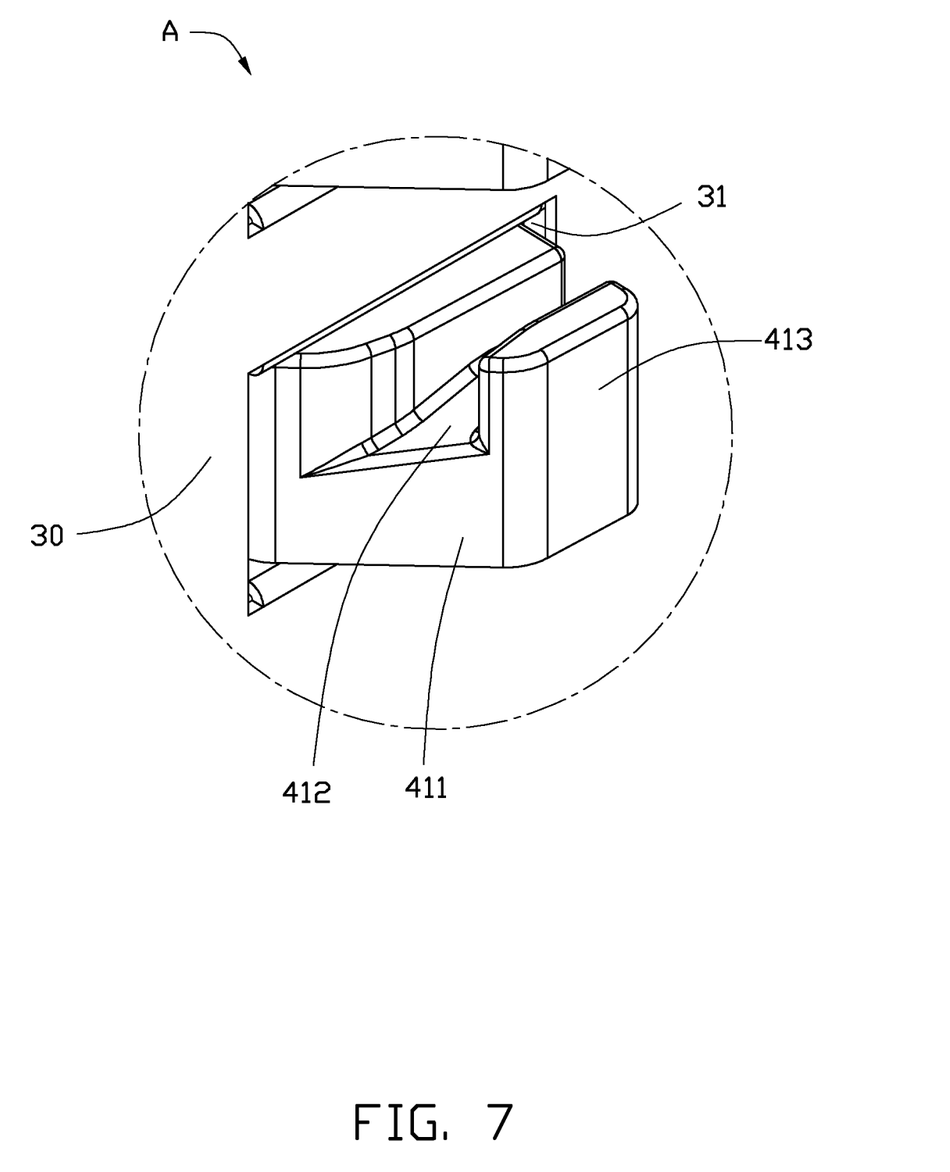
FIG. 7 is a magnified view of the circled portion A of FIG. 3.
Figure 8:
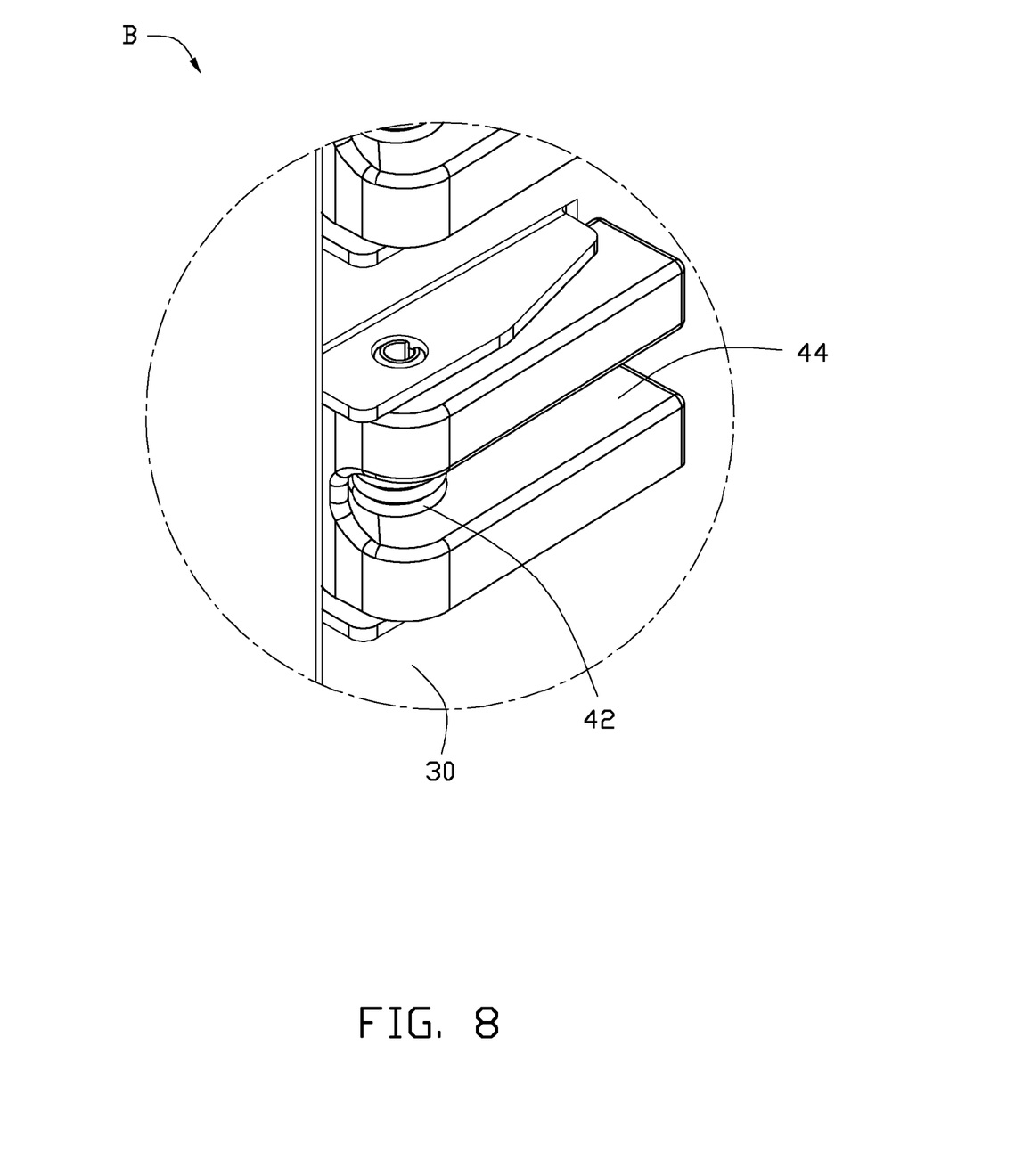
FIG. 8 is a magnified view of the circled portion B of FIG. 3.

Further referring to FIG. 4, each lateral plate 30 defines a number of rows of receiving holes 31. Each receiving hole 31 can be used for receiving one supporting structure 40. In the present embodiment, each row of the receiving holes 31 includes three receiving holes 31. The supporting structures 40 in one row cooperatively support one server 200. In the present embodiment, the receiving holes 31 are through holes. In other embodiment, the receiving holes 31 can not run through the outer surface of the lateral plate 30, if the thickness of the lateral plate 30 is big enough.

Further referring to FIGS. 5 to 8, each supporting structure 40 includes a supporting block 41, a torsion spring 42, and a rotating shaft 43.

The supporting block 41 is received in the receiving hole 31, and is pivotably connected to the lateral plate 30 via the rotating shaft 43. The supporting block 41 includes a guide surface 411 facing towards the inserting opening 101, a sliding slot 412 facing towards the top plate 20, and a resisting surface 413 facing towards interior of the server holder 100. The supporting block 41 further defines a receiving groove 414 on a surface thereof facing away from the resisting surface 413. The guide surface 411 is configured for guiding the servers 200 during the servers 200 being inserting into the server holder 200. The sliding rail 220 of the server 200 can slide along the sliding slot 412. The resisting surface 413 is configured for resisting against the server 200 to fix the server 200. In the present embodiment, the supporting block 41 further defines a shaft hole 415. The rotating shaft 43 passes through the shaft hole 415 and the torsion spring 42. Two ends of the rotating shaft 43 are positioned on the lateral surface 30. The resisting surface 413 can be moved along a direction substantially perpendicular to the lateral plate 30 by rotating the supporting block 41.

The torsion spring 42 is received in the receiving groove 414, and is sleeved over the rotating shaft 43. The torsion spring 42 includes a first leg 421 and a second leg 422. The first leg 421 resists against a bottom wall of the receiving groove 414, and the second leg 422 resists against the lateral plate 30. The torsion spring 42 is configured for providing an elastic force to push the supporting block 41 to keep the resisting surface 413 resisting against the sidewall 210 of the server 200 when the server 200 is received in the server holder 100.

When the server 200 is inserted into the server holder 100, the front end of the server 100 will push the guide surface 411 of the supporting block to rotate the supporting block 41, the torsion spring 42 is compressed, and the sliding rail 220 is inserted into the sliding slot 412. When the server 200 is received in the server holder 100, the resisting surface 413 of the supporting block 41 resists against the sidewall 210 of the server 200 tightly, thus, the server 200 can be fixed in the server holder 100 firmly.

While certain embodiments have been described and exemplified above, various other embodiments will be apparent to those skilled in the art from the foregoing disclosure. The disclosure is not limited to the particular embodiments described and exemplified, and the embodiments are capable of considerable variation and modification without departure from the scope and spirit of the appended claims.

What is claimed is:

1. A server holder for receiving at least one server, the server comprising two opposite sidewalls, each sidewall having a sliding rail, the server holder comprising:
   two opposite lateral plates, each lateral plate defining a plurality of rows of receiving holes; and
   a plurality of supporting structures, each supporting structure being received in one receiving hole, each supporting structure comprising:
      a supporting block pivotably connected to a corresponding one of the lateral plates, the supporting block defining a sliding slot, and comprising a resisting surface facing towards interior of the server holder, the sliding rail on each sidewall being configured to slide along the sliding slot; and
      a torsion spring positioned on the supporting block to provide an elastic force to push the supporting block to keep the resisting surface resisting against a corresponding sidewall.

2. The server holder as claimed in claim 1, wherein the server holder comprises a top plate, and the sliding slot faces towards the top plate.

3. The server holder as claimed in claim 2, wherein the two opposite lateral plates are parallel to each other, and are perpendicular to the top plate.

4. The server holder as claimed in claim 1, wherein the server holder defines an inserting opening between the two opposite lateral plates, and the supporting block comprises a guide surface facing towards the inserting opening.

5. The server holder as claimed in claim 1, wherein the supporting block defines a receiving groove on a surface thereof facing away from the resisting surface, the torsion spring is received in the receiving groove, the torsion spring comprises a first leg resisting against a bottom wall of the receiving groove, and a second leg resisting against the corresponding lateral plate.

6. The server holder as claimed in claim 1, wherein the supporting structures received in one row of the receiving holes are configured to cooperatively support one server.

7. The server holder as claimed in claim 1, wherein the receiving holes are through holes.

8. The server holder as claimed in claim 1, wherein each supporting structure comprises a rotating shaft, the supporting block defines a shaft hole, the rotating shaft passes through the shaft hole and the torsion spring, two ends of the rotating shaft are positioned on the corresponding lateral surface, the supporting block is pivotably connected to the corresponding lateral plate via the rotating shaft.

9. The server holder as claimed in claim 1, wherein the resisting surface is capable of moving along a direction substantially perpendicular to the corresponding lateral plate by rotating the supporting block.

10. A server system comprising:
   at least one server, each server comprising two opposite sidewalls, each sidewall having a sliding rail; and
   a server holder receiving the at least one server, the server holder comprising:
      two opposite lateral plates, each lateral plate defining a plurality of rows of receiving holes; and
      a plurality of supporting structures, each supporting structure being received in one receiving hole, each supporting structure comprising:
         a supporting block pivotably connected to a corresponding one of the lateral plates, the supporting block defining a sliding slot, and comprising a resisting surface facing towards interior of the server holder, the sliding slot receiving a corresponding sliding rail and allowing the corresponding sliding rail to slide and
         a torsion spring positioned on the supporting block to provide an elastic force
         to push the supporting block to keep the resisting surface resisting against a corresponding sidewall.

11. The server system as claimed in claim 10, wherein the sliding rail on the sidewall extends from a top end of the sidewall.

12. The server system as claimed in claim 10, wherein the server holder comprises a top plate, and the sliding slot faces towards the top plate.

13. The server system as claimed in claim 12, wherein the two opposite lateral plates are parallel to each other, and are perpendicular to the top plate.

14. The server system as claimed in claim 10, wherein the server holder defines an inserting opening between the two opposite lateral plates, and the supporting block comprises a guide surface facing towards the inserting opening.

15. The server system as claimed in claim 10, wherein the supporting block defines a receiving groove on a surface thereof facing away from the resisting surface, the torsion spring is received in the receiving groove, the torsion spring comprises a first leg resisting against a bottom wall of the receiving groove, and a second leg resisting against the corresponding lateral plate.

16. The server system as claimed in claim 10, wherein the supporting structures received in one row of the receiving holes cooperatively support one server.

17. The server system as claimed in claim 10, wherein the receiving holes are through holes.

18. The server system as claimed in claim 10, wherein each supporting structure comprises a rotating shaft, the supporting block defines a shaft hole, the rotating shaft passes through the shaft hole and the torsion spring, two ends of the rotating shaft are positioned on the corresponding lateral surface, the supporting block is pivotably connected to the corresponding lateral plate via the rotating shaft.

19. The server system as claimed in claim 10, wherein the resisting surface is capable of moving along a direction substantially perpendicular to the corresponding lateral plate by rotating the supporting block.

* * * * *